(12) United States Patent
Wann et al.

(10) Patent No.: US 9,508,849 B2
(45) Date of Patent: Nov. 29, 2016

(54) DEVICE HAVING SOURCE/DRAIN REGIONS REGROWN FROM UN-RELAXED SILICON LAYER

(71) Applicant: Taiwan Semiconductor Manufacturing Company, Ltd., Hsin-Chu (TW)

(72) Inventors: Clement Hsingjen Wann, Carmel, NY (US); Chih-Hsin Ko, Fongshan (TW); Yao-Tsung Huang, Kaohsiung (TW); Cheng-Ying Huang, Kaohsiung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 116 days.

(21) Appl. No.: 14/078,141

(22) Filed: Nov. 12, 2013

(65) Prior Publication Data

US 2014/0138742 A1  May 22, 2014

Related U.S. Application Data

(62) Division of application No. 13/189,119, filed on Jul. 22, 2011, now Pat. No. 8,609,518.

(51) Int. Cl.
*H01L 29/78* (2006.01)
*H01L 29/66* (2006.01)
*H01L 29/165* (2006.01)

(52) U.S. Cl.
CPC ......... *H01L 29/7848* (2013.01); *H01L 29/165* (2013.01); *H01L 29/66795* (2013.01); *H01L 29/785* (2013.01)

(58) Field of Classification Search
CPC ........... H01L 27/1108; H01L 27/1214; H01L 27/12; H01L 27/0688; H01L 27/11; H01L 27/11807; H01L 27/0207; H01L 21/823807; H01L 27/1104; H01L 21/82; H01L 21/823842; H01L 21/8249; H01L 29/7848; H01L 29/165; H01L 29/66795; H01L 29/785

See application file for complete search history.

(56) References Cited

U.S. PATENT DOCUMENTS

2004/0219726 A1* 11/2004 Fitzgerald ..................... 438/197
2004/0259315 A1* 12/2004 Sakaguchi ........ H01L 29/66795
                                                                    438/285

(Continued)

OTHER PUBLICATIONS

Chu, M., et al. "Comparison between high-field piezoresistance coefficients of Si metal-oxide-semiconductor field-effect transistors and bulk Si under Uniaxial and biaxial stress," Journal of Applied Physics 103, 113704, 2008, 7 pages.
Eguchi, S., et al., "Comparison of arsenic and phosphorus diffusion behavior in silicon—germanium alloys," Applied Physics Letters, vol. 80, No. 10, Mar. 10, 2002, pp. 1743-1745.

(Continued)

*Primary Examiner* — Michelle Mandala
(74) *Attorney, Agent, or Firm* — Slater Matsil, LLP

(57) ABSTRACT

A device including a silicon substrate, a silicon germanium layer, a silicon layer, a gate stack, and silicon-containing stressors is provided. In an embodiment, the silicon germanium layer is disposed over a silicon substrate and relaxed while the silicon layer is disposed over the silicon germanium layer and un-relaxed. The silicon layer may be free from germanium. The gate stack is of an n-type metal-oxide-semiconductor (NMOS) field-effect transistor (FET) and disposed over the silicon layer and the silicon germanium layer. A portion of the silicon layer forms a channel region of the NMOS FET. The silicon-containing stressors are formed in recesses in the silicon layer and have a lattice constant smaller than a lattice constant of the silicon germanium layer.

20 Claims, 9 Drawing Sheets

(56) References Cited

U.S. PATENT DOCUMENTS

| | | |
|---|---|---|
| 2006/0011984 A1 | 1/2006 | Currie |
| 2006/0030093 A1 | 2/2006 | Zhang et al. |
| 2007/0057287 A1 | 3/2007 | Lin et al. |
| 2007/0190730 A1 | 8/2007 | Huang et al. |
| 2007/0238250 A1 | 10/2007 | Zhang et al. |
| 2011/0303980 A1 | 12/2011 | Sultan et al. |

OTHER PUBLICATIONS

Jang, S.M., et al. "Phosphorus doping of epitaxial Si and Si1-xGex at very low pressure," Applied Physics Letters, vol. 63, No. 12, Sep. 20, 1993, pp. 1675-1677.

Schindler, M. et al., "Selective epitaxial growth of Arsenic-doped SiGe-Structures with LPCVD," ECS Transactions, 1 (30), 2006, pp. 33-40.

* cited by examiner

DEVICE HAVING SOURCE/DRAIN REGIONS REGROWN FROM UN-RELAXED SILICON LAYER

CROSS-REFERENCE TO RELATED APPLICATIONS

This application is a divisional of co-pending U.S. patent application Ser. No. 13/189,119, filed on Jul. 22, 2011, entitled "Re-growing Source/Drain Regions from Un-Relaxed Silicon Layer," which application is hereby incorporated herein by reference.

BACKGROUND

Inducing tensile stresses in the channels of n-type metal-oxide-semiconductor (NMOS) field-effect transistors (FETs) help improve the electron mobility in the channel regions. Inducing compressive stresses in the channels of p-type metal-oxide-semiconductor (PMOS) FETs help improve the hole mobility in the channel regions. With the improved carrier mobility, the drive currents of the NMOS FETs and PMOS FETs may be improved. There were various methods and structures for increasing the stresses in the NMOS and PMOS FETs, and new methods and structures are still being explored to further increase the stresses.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

An n-type metal-oxide-semiconductor (NMOS) field-effect transistor (FET) and the method of forming the same are provided in accordance with embodiments. The intermediate stages of manufacturing various embodiments are illustrated. The variations of the embodiments are discussed. Throughout the various views and illustrative embodiments, like reference numbers are used to designate like elements.

Figure 1:
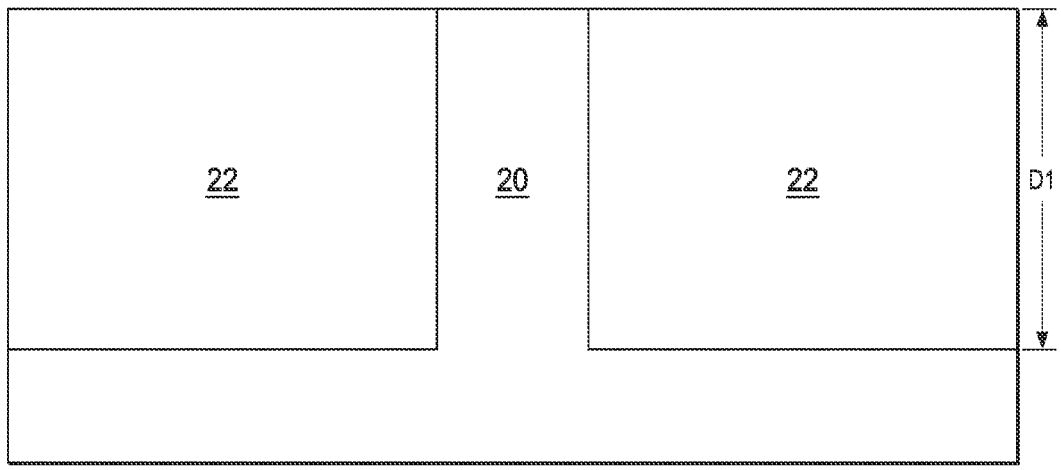
FIGS. 1 through 9 are cross-sectional views of intermediate stages in the manufacturing of an n-type metal-oxide-semiconductor (NMOS) fin field-effect transistor (FinFET) in accordance with embodiments.

Referring to FIG. 1, substrate 20, which may be a portion of a semiconductor wafer, is provided. Substrate 20 may be a semiconductor substrate. In an embodiment, substrate 20 is a silicon substrate with no germanium therein, although it may also be formed of silicon germanium (SiGe). Insulators such as shallow trench isolation (STI) regions 22 are formed in substrate 20. Depth D1 of STI regions 22 may be between about 50 nm and about 300 nm, or between about 100 nm and about 400 nm. It is realized, however, that the dimensions recited throughout the description are merely examples, and may be changed to different values. STI regions 22 may be formed by recessing semiconductor substrate 20 to form openings, and then filling the openings with dielectric materials. STI regions 22 may include two neighboring regions having their sidewalls facing each other, with a portion of substrate 20 between, and adjoining, the two neighboring STI regions 22.

Figure 2:
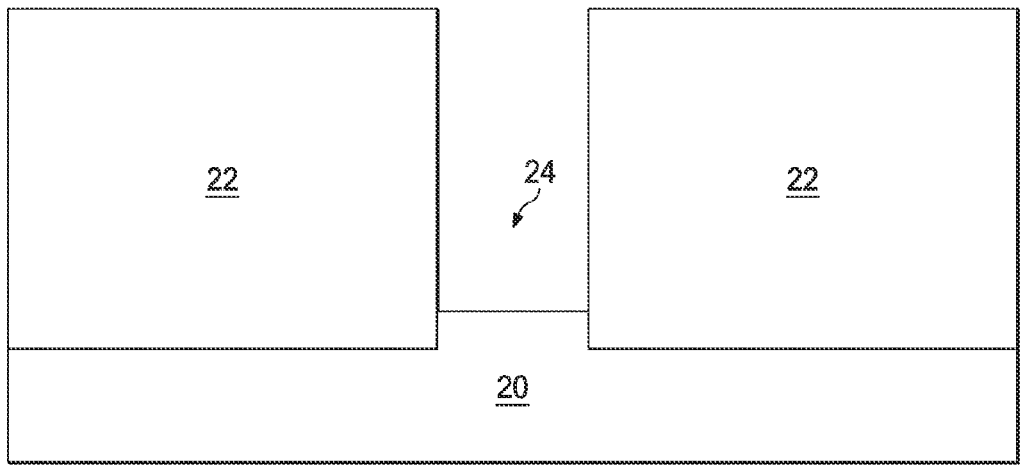

Referring to FIG. 2, the portion of substrate 20 that is between two neighboring STI regions 22 is removed, forming opening 24. In an embodiment, the bottom of opening 24 is level with the bottoms of STI regions 22. In alternative embodiments, the bottom of opening 24 may be lower than or higher than the bottoms of STI regions 22.

Figure 3:
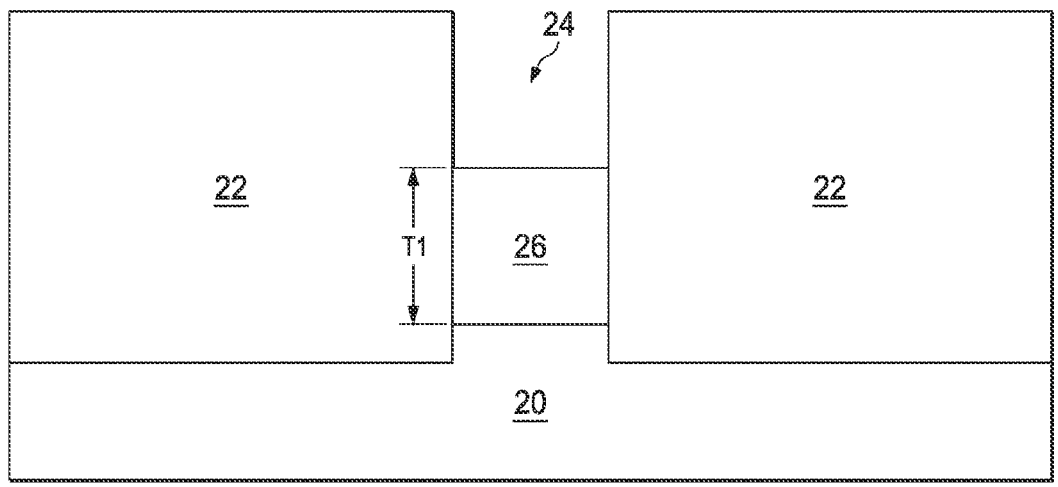

FIG. 3 illustrates the formation of SiGe layer 26 in opening 24. The methods for forming SiGe layer 26 include, for example, selective epitaxial growth (SEG). SiGe layer 26 may be expressed as $Si_{1-x}Ge_x$, wherein x is the atomic percentage of germanium in the silicon germanium, and x may be greater than 0, and is equal to or less than 1. When x is equal to about 1, SiGe layer 26 is formed of substantially pure germanium. In an exemplary embodiment, x is between about 0.1 and about 1. SiGe layer 26 has thickness T1, which may be between about 10 nm and about 200 nm. SiGe layer 26 is at least partially relaxed, which means SiGe layer 26 may be partially, or fully, relaxed. This may be achieved by using certain techniques such as making thickness T1 to be great enough, for example. Accordingly, the lattice constant of SiGe layer 26 is greater than the lattice constant of crystalline silicon, which is 5.43 Å. Depending on the atomic percentage x, the lattice constant of SiGe layer 26 may be between 5.43 Å and about 5.65 Å (the lattice constant of pure germanium), with a greater x value corresponding to a greater lattice constant.

Figure 4:
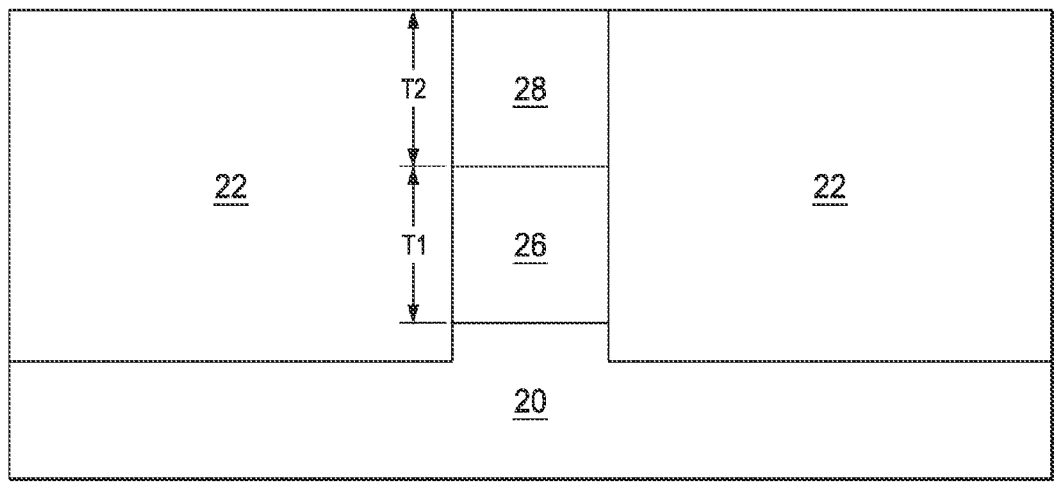

In FIG. 4, silicon-containing layer 28 is epitaxially grown on SiGe layer 26. Silicon-containing layer 28 may have substantially pure silicon with substantially no germanium added, or alternatively, formed of silicon germanium that is expressed as $Si_{1-z}Ge_z$, wherein z is the atomic percentage of germanium in silicon-containing layer 28, and atomic percentage z may be equal to or greater than 0, and equal to or less than 1. Furthermore, atomic percentage z may be smaller than atomic percentage x of SiGe layer 26. With the proceeding of the epitaxial growth of silicon-containing layer 28, a p-type impurity such as boron and/or indium may be in-situ added to a low impurity concentration. Alternatively, the p-type impurity may be doped by implantation. The top surface of silicon-containing layer 28 may be substantially level with, or lower than, top surfaces of STI regions 22. Silicon-containing layer 28 has thickness T2, which may be between about 10 nm and about 100 nm. Thickness T2 is also small enough so that silicon-containing layer 28 is un-relaxed, either fully or partially, un-relaxed. For example, thickness T2 may be smaller than thickness T1. When silicon-containing layer 28 is un-relaxed, at least partially, the lattice constant of silicon-containing layer 28 is greater than the lattice constant of crystalline silicon, which is 5.43 Å, and may be equal to or substantially equal to (when silicon-containing layer 28 is fully un-relaxed) the lattice constant of SiGe layer 26, or smaller than (when silicon-containing layer 28 is partially un-relaxed) the lattice constant of SiGe layer 26. Accordingly, a tensile stress is generated in silicon-containing layer 28.

Figure 5A:
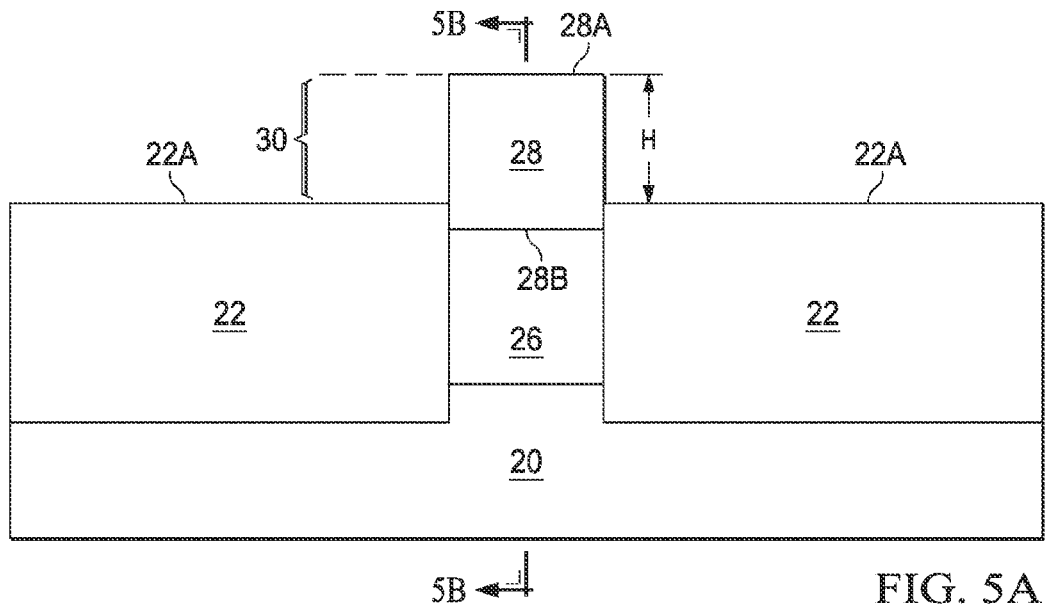
Figure 5B:
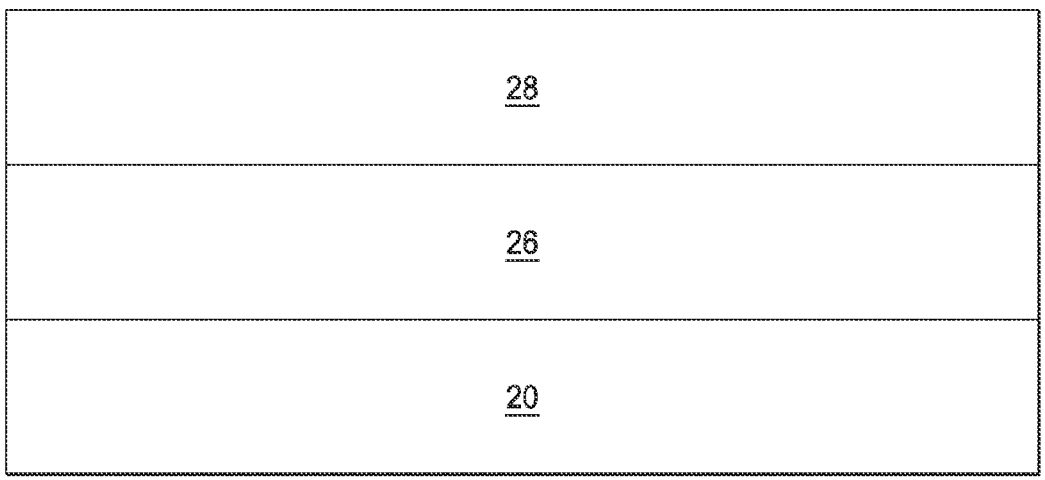

Referring to FIG. 5A, STI regions 22 are recessed, so that top surface 28A of silicon-containing layer 28 is higher than top surfaces 22A of the remaining portions of STI regions 22. In an embodiment, top surfaces 22A may be at an intermediate level that is between top surface 28A and bottom surface 28B of silicon-containing layer 28. In alternative embodiments, top surfaces 22A may be level with, or lower than, bottom surface 28B. Throughout the description, the portion of silicon-containing layer 28 (and possibly SiGe layer 26) that are over top surfaces 22A is referred to as fin 30. Fin 30 has fin height H. In an exemplary embodiment, fin height H is between about 10 nm and about 50 nm. FIG. 5B illustrates a cross-sectional view of the structure shown in FIG. 5A, wherein the cross-sectional view is obtained from the vertical plane crossing line 5B-5B in FIG. 5A.

Figure 6A:
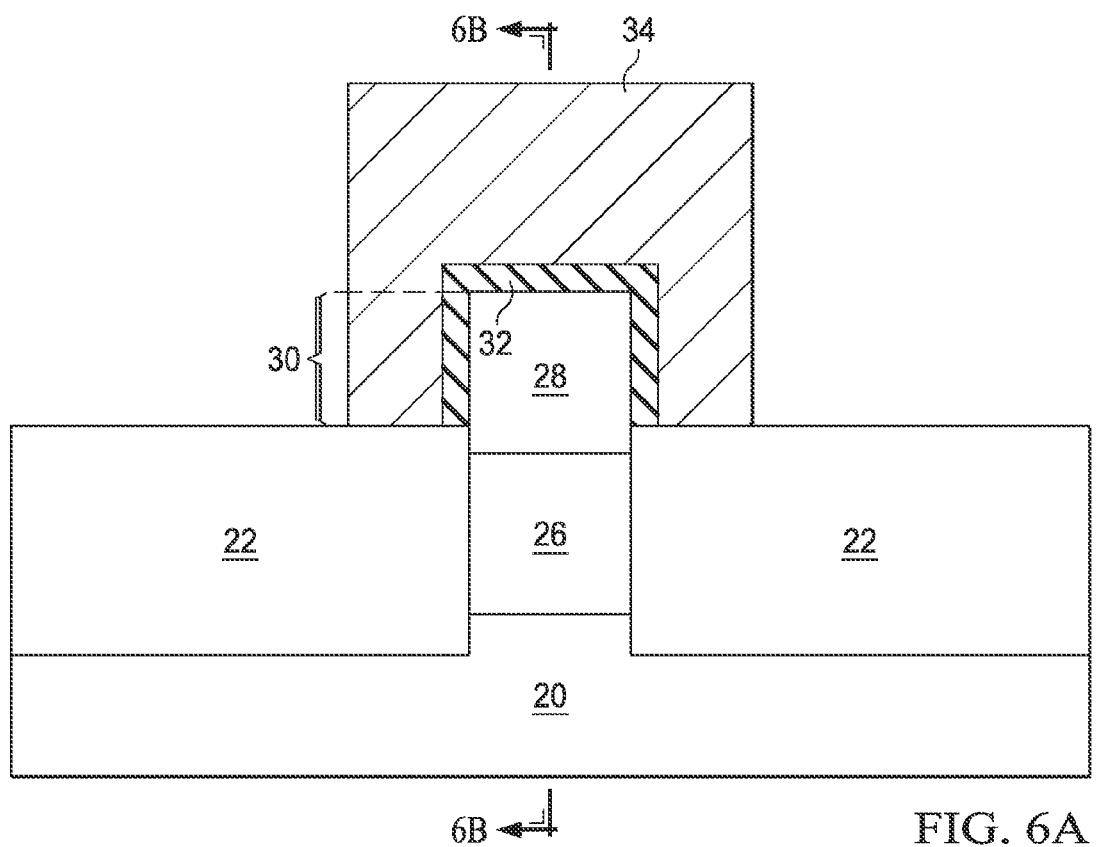
Figure 6B:
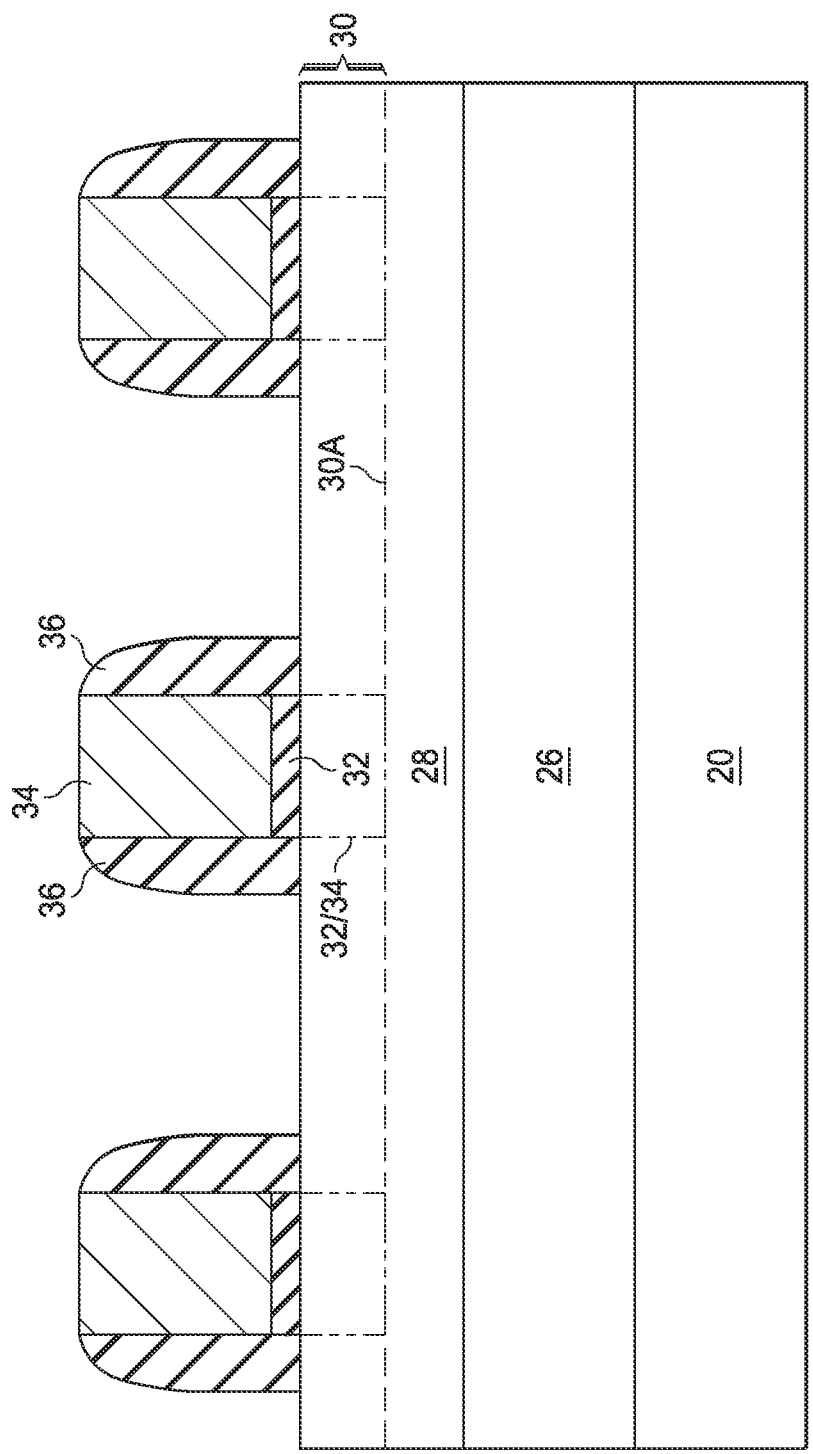

FIGS. 6A and 6B illustrate the formation of gate dielectric 32, gate electrode 34, and gate spacers 36. Referring to FIG. 6A, gate dielectric 32 is formed on the sidewalls and the top surface of fin 30. The material of gate dielectric 32 may include silicon oxide, silicon nitride, or high-k dielectric materials such as Hf-containing dielectrics or any other kind of high-k materials, and the like. Gate electrode 34 may be formed of polysilicon, metals, metal silicides, and the like. FIG. 6B is a cross-sectional view of the structure shown in FIG. 6A, wherein the cross-sectional view is obtained from the vertical plane crossing line 6B-6B in FIG. 6A. Gate spacers 36 are formed on the sidewalls of gate dielectric 32 and gate electrode 34. In FIG. 6B, dotted lines are used to illustrate the portions of gate dielectric 32 and gate electrode 34 that are on the sidewalls of fin 30, since these portions of gate dielectric 32 and gate electrode 34 are not in the plane that is indicated as 6B-6B in FIG. 6A. Furthermore, in FIG. 6B, the bottom level of fin 30 is marked as 30A.

Figure 7:
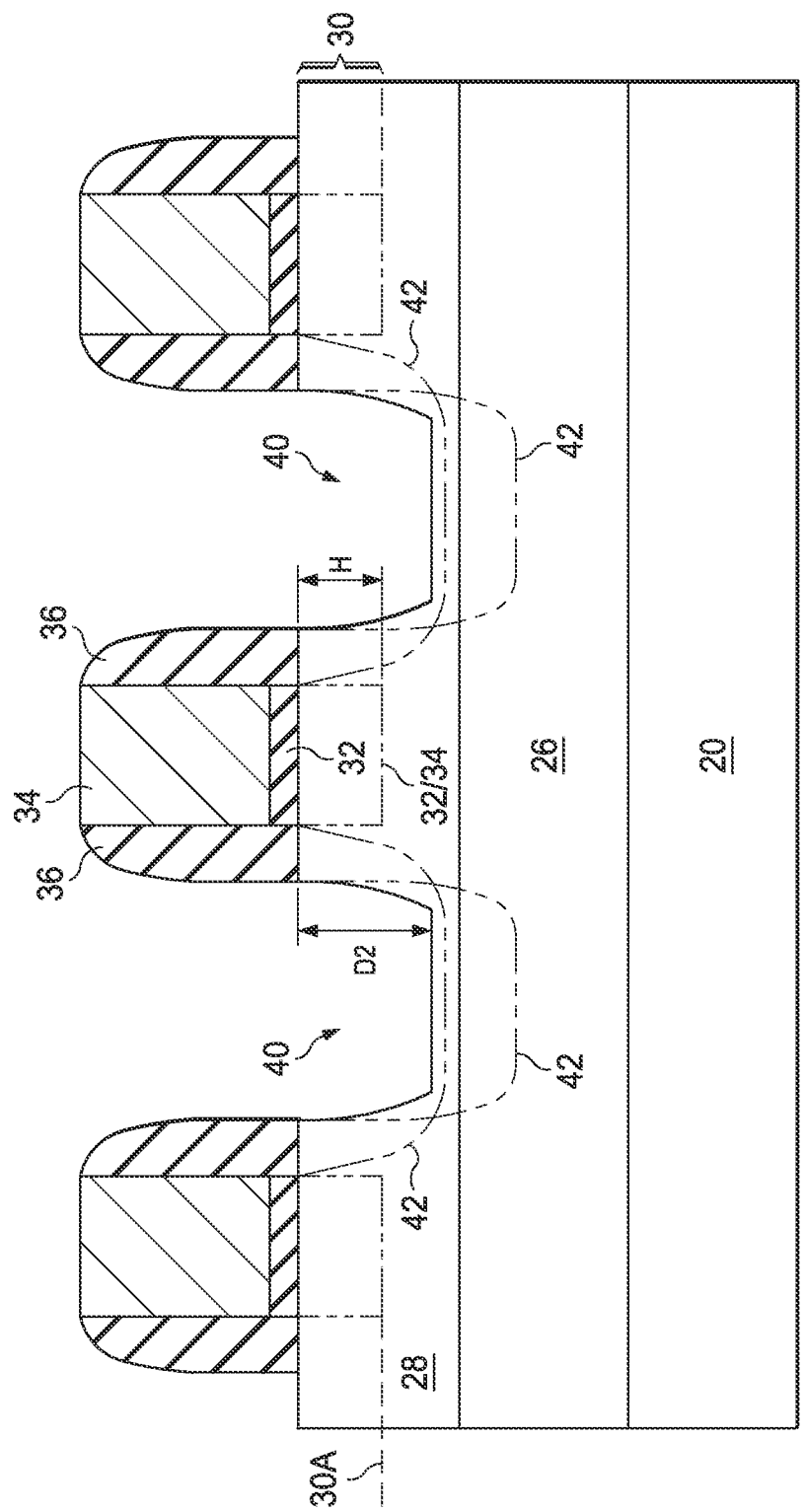

Referring to FIG. 7, which is a cross-sectional view obtained from the same plane as in FIG. 6B, recesses 40 are formed, for example, by etching into silicon-containing layer 28. In an embodiment, recesses 40 extend into silicon-containing layer 28, and do not extend into SiGe layer 26. In alternative embodiments, recesses extend down into SiGe layer 26. Depth D2 of recesses 40 may be between about one time to two times fin height H of fin 30. The edges of recesses 40 may be substantially vertically aligned to the outer edges of gate spacers 36. In other embodiments, recesses 40 may extend down to directly underlying gate spacers 36. Dashed lines 42 illustrate the positions of the sidewalls and bottoms of recesses 40 in accordance with alternative embodiments.

Figure 8:
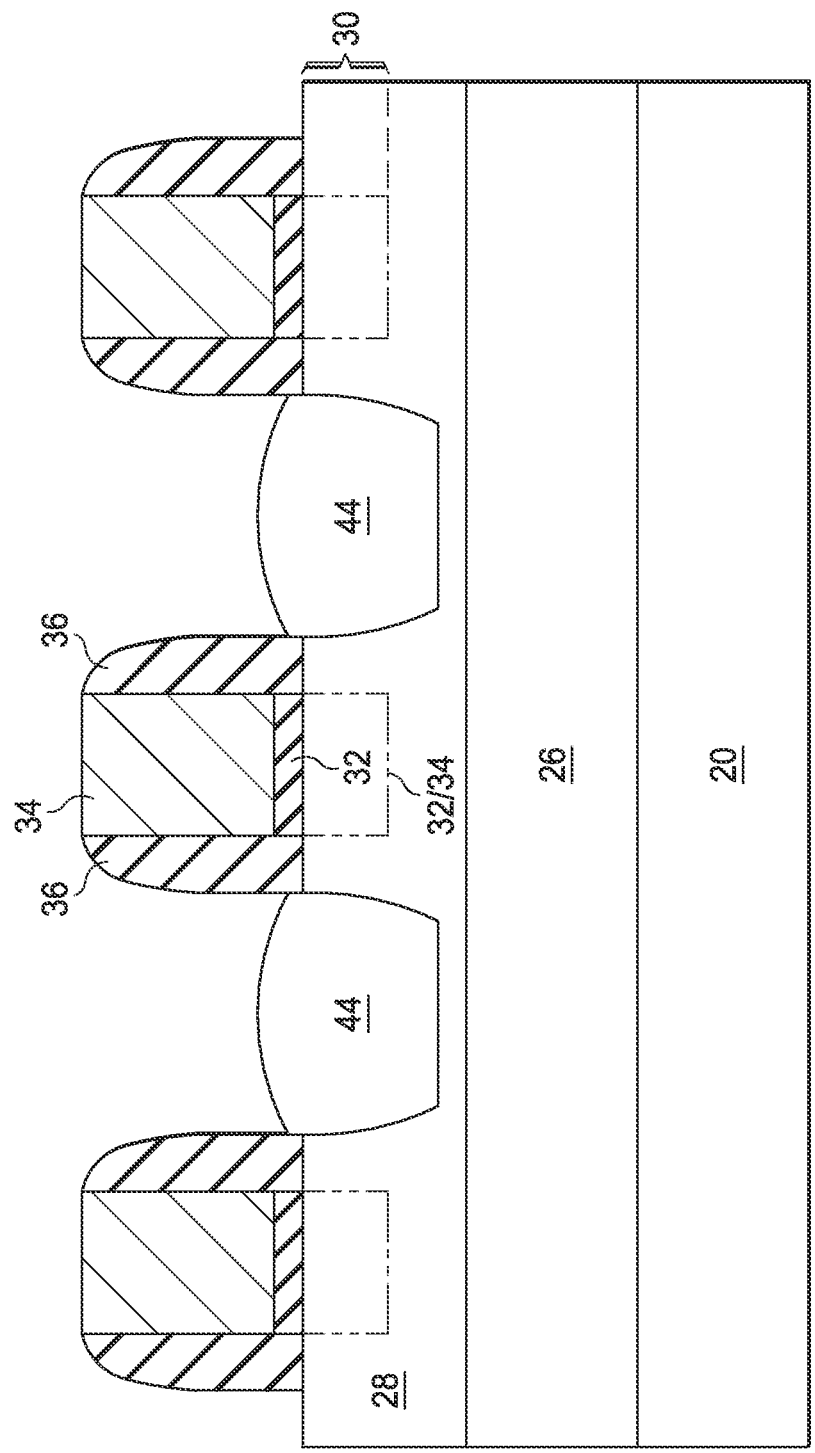

FIG. 8 illustrates the epitaxial growth of source/drain stressors 44, which may also be formed through SEG. During the epitaxial growth of source/drain stressors 44 (which are also source/drain regions), an n-type impurity such as phosphorous, arsenic, or combinations thereof, may be in-situ doped with the proceeding of the epitaxial growth of source/drain stressors 44. The resulting n-type impurity concentration in source/drain stressors 44 may be between about $10^{19}/cm^3$ and about $10^{22}/cm^3$. In an embodiment, the material of source/drain stressors 44 may be expressed as $Si_{1-y}Ge_y$, wherein value y represents the atomic percentage of germanium, and is between (and may be equal to) 0 and 1. When y is equal to about 0, source/drain stressors 44 are silicon regions that have substantially no germanium added. Germanium percentage y in source/drain stressors 44 may be smaller than germanium atomic percentage x in SiGe layer 26, and may be smaller than germanium atomic percentage z in silicon-containing layer 28 when silicon-containing layer 28 comprises silicon germanium. In an embodiment, a difference between germanium atomic percentages x and y is greater than about 0.

Figure 9:
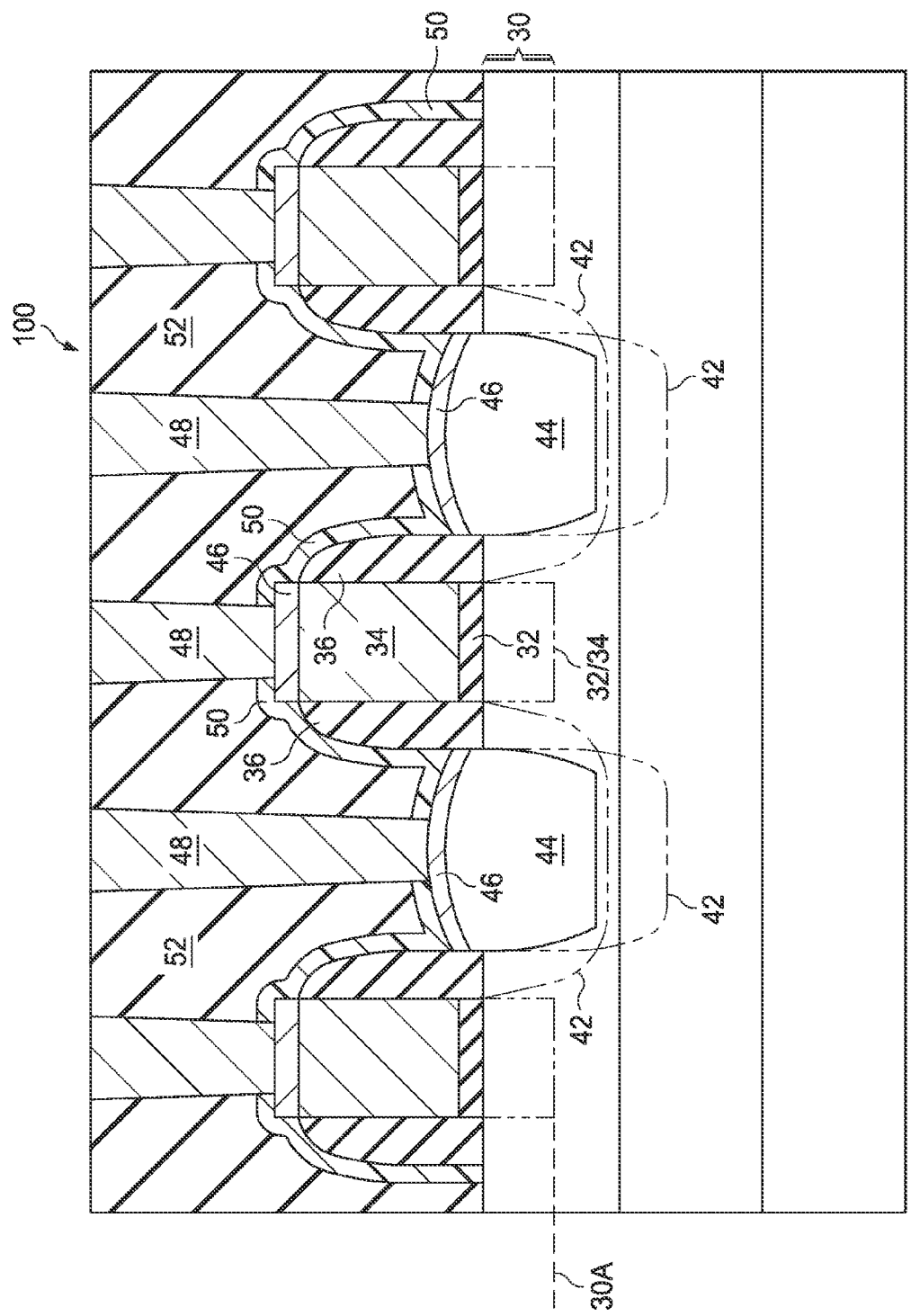

FIG. 9 illustrates the formation of remaining portions of NMOS FinFET 100, which components include silicide regions 46, contact plugs 48, contact etch stop layer 50, and inter-layer dielectric (ILD) 52. In the resulting NMOS FinFET 100, depending on the bottom position of recesses 40 (FIG. 7), source/drain stressors 44 may extend into SiGe layer 26, or alternatively, not extend into SiGe layer 26. Furthermore, source/drain stressors 44 may extend down to lower than bottom level 30A of fin 30, or have bottom surfaces substantially level with bottom level 30A of fin 30.

Figure 10:
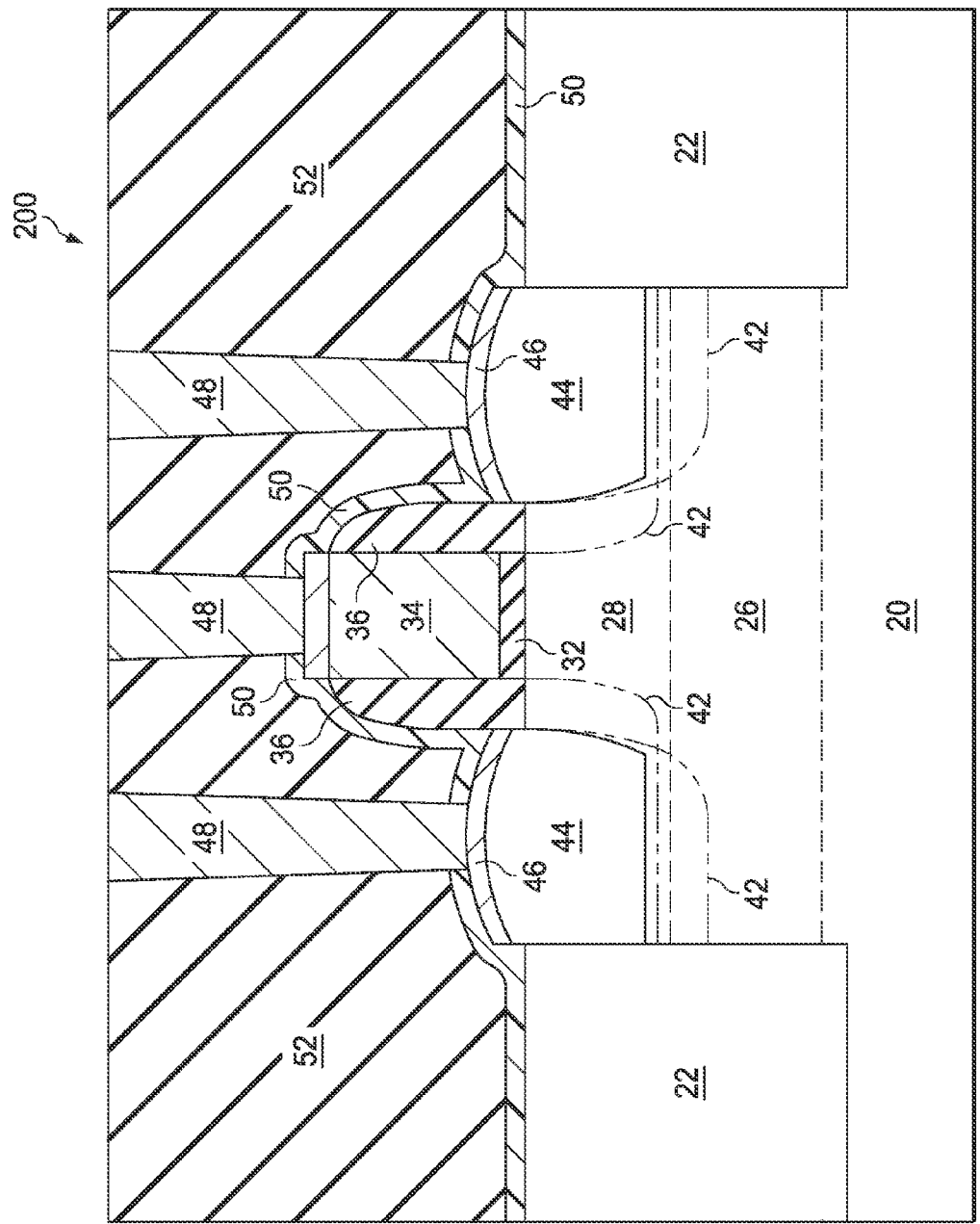
FIG. 10 illustrates a cross-sectional view of a planar p-type metal-oxide-semiconductor (PMOS) field-effect transistor (FET) in accordance with alternative embodiments.

FIG. 10 illustrates planar NMOS FET 200 in accordance with alternative embodiments. Unless specified otherwise, the reference numerals in these embodiments represent like elements in the embodiments illustrated in FIGS. 1 through 9. The materials, dimensions, and the process steps for forming SiGe layer 26, silicon-containing layer 28, and source/drain stressors 44 may be essentially the same as the formation of the respective components in NMOS FinFET 100. The formation process may include forming STI regions 22 in substrate 20. A recess similar to recess 24 in FIG. 2 is then formed in substrate 20, followed by the epitaxial growth of SiGe layer 26 and silicon-containing layer 28. Similarly, SiGe layer 26 is relaxed, so that its lattice constant is greater than the lattice constant of silicon. Silicon-containing layer 28, on the other hand, is un-relaxed, (either fully or partially), and its lattice constant is greater than the lattice constant of crystalline silicon, and may be substantially equal to the lattice constant of SiGe layer 26. Accordingly, a tensile stress is generated in silicon-containing layer 28. The step as shown in FIGS. 5A and 5B, which step is for forming a fin, is skipped. In subsequent process steps, gate dielectric 32, gate electrode 34, and source/drain stressors 44 are formed using essentially the same methods as for forming the corresponding components in NMOS FinFET 100.

In the embodiments, source/drain stressors 44 are epitaxially grown from the un-relaxed silicon-containing layer 28, which has the lattice constant substantially equal to the lattice constant of SiGe layer 26. In addition, the germanium percentage of source/drain stressors 44 is lower than the germanium percentage of SiGe layer 26. Accordingly, source/drain stressors 44 has a lattice constant smaller than the lattice constant of SiGe layer 26, and smaller than the lattice constant of the un-relaxed silicon-containing layer 28. As a result, the formation of source/drain stressors 44 results in a further increase in the tensile stress of the channel region of NMOS FinFET 100 (FIG. 9) or planar NMOS FET 200 (FIG. 10). The tensile stresses in the channel regions of the resulting NMOS FinFET 100 and planar NMOS FET 200 are thus greater than the respective NMOS FinFET and planar NMOS FET whose source/drain regions are formed by implanting n-type impurities, rather than by the epitaxial growth.

In addition, the epitaxial growth of source/drain stressors 44 (FIG. 8) makes the in-situ doping of phosphorous or arsenic possible. The in-situ doping of phosphorous or arsenic results in abrupt source/drain junctions, shallow source/drain junctions, and improved short channel effect. Furthermore, the concentrations of in-situ doped n-type impurities are higher than that in the source/drain regions that are formed through implantations. As a result of the increased impurity concentrations, the resistivities of the source/drain regions are reduced.

An embodiment device includes a silicon germanium layer over a silicon substrate, wherein the silicon germanium layer is relaxed, a silicon layer over the silicon germanium layer, wherein the silicon layer is un-relaxed, and wherein the silicon layer is substantially free from germanium, a gate stack of an n-type metal-oxide-semiconductor (NMOS) field-effect transistor (FET) over the silicon layer and the silicon germanium layer, wherein a portion of the silicon layer forms a channel region of the NMOS FET, and silicon-containing stressors formed in recesses in the silicon layer, wherein the silicon-containing stressors have a lattice constant smaller than a lattice constant of the silicon germanium layer.

An embodiment device includes a silicon germanium layer over a silicon substrate, wherein the silicon germanium layer is at least partially relaxed, a silicon layer over the silicon germanium layer, wherein the silicon layer is at least partially un-relaxed, and wherein an atomic percentage of the silicon layer is lower than an atomic percentage of the silicon germanium layer, a gate stack of an n-type metal-oxide-semiconductor (NMOS) field-effect transistor (FET) over the silicon layer and the silicon germanium layer, wherein a portion of the silicon layer forms a channel region of the NMOS FET, and silicon-containing stressors formed in recesses in the silicon layer, wherein the silicon-containing stressors have a lattice constant smaller than a lattice constant of the silicon germanium layer.

An embodiment device a silicon-containing layer stacked on a silicon germanium layer supported by a silicon substrate, the silicon germanium layer is relaxed, the silicon layer un-relaxed and substantially free from germanium, isolation regions abutting sidewalls of the silicon substrate, the silicon germanium layer, and the silicon layer, a gate stack of an n-type metal-oxide-semiconductor (NMOS) field-effect transistor (FET) over the silicon layer and the silicon germanium layer, wherein a portion of the silicon layer forms a channel region of the NMOS FET, and silicon-containing stressors formed in recesses in the silicon layer, wherein the silicon-containing stressors have a lattice constant smaller than a lattice constant of the silicon germanium layer.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
   a silicon germanium layer over a silicon substrate, wherein the silicon germanium layer is relaxed;
   a silicon layer over the silicon germanium layer, wherein the silicon layer is un-relaxed, and wherein the silicon layer is free from germanium, wherein the silicon layer has a thickness smaller than a thickness of the silicon germanium layer;
   a gate stack of an n-type metal-oxide-semiconductor (NMOS) field-effect transistor (FET) over the silicon layer and the silicon germanium layer, wherein a portion of the silicon layer forms a channel region of the NMOS FET;
   silicon-containing stressors formed in recesses in the silicon layer, wherein the silicon-containing stressors have a lattice constant smaller than a lattice constant of the silicon germanium layer; and
   source/drain regions on opposing sides of the gate stack, the source/drain regions being disposed in the silicon-containing stressors.

2. The device of claim 1, wherein the silicon-containing stressors are free from germanium.

3. The device of claim 1, wherein the silicon-containing stressors comprise germanium, and have a germanium atomic percent lower than a germanium atomic percent of the silicon germanium layer.

4. The device of claim 1, wherein the NMOS FET is a FinFET, wherein the silicon layer forms a fin of the FinFET, and wherein the silicon-containing stressors do not extend into the silicon germanium layer.

5. The device of claim 1, wherein the NMOS FET is a FinFET, wherein the silicon layer forms a fin of the FinFET, and wherein the silicon-containing stressors extend into the silicon germanium layer.

6. The device of claim 1, wherein the NMOS FET is a planar NMOS FET.

7. A device comprising:
   a silicon germanium layer over a silicon substrate, wherein the silicon germanium layer is at least partially relaxed;
   a silicon-containing layer over the silicon germanium layer, wherein the silicon-containing layer is at least partially un-relaxed, and wherein an atomic percentage of germanium in the silicon-containing layer is lower than an atomic percentage of germanium in the silicon germanium layer;
   a gate stack of an n-type metal-oxide-semiconductor (NMOS) field-effect transistor (FET) over the silicon-containing layer and the silicon germanium layer, wherein a portion of the silicon-containing layer forms a channel region of the NMOS FET; and
   silicon-containing stressors formed in recesses in the silicon-containing layer, wherein the silicon-containing stressors have a lattice constant smaller than a lattice constant of the silicon germanium layer, wherein the silicon-containing stressors comprise germanium, and have a germanium atomic percent lower than a germanium atomic percent of the silicon germanium layer.

8. The device of claim 7, wherein the silicon-containing stressors are free from germanium.

9. The device of claim 7, wherein the silicon-containing layer has a thickness smaller than a thickness of the silicon germanium layer.

10. The device of claim 7, wherein the NMOS FET is a FinFET, wherein the silicon-containing layer forms a fin of the FinFET, and wherein the silicon-containing stressors do not extend into the silicon germanium layer.

11. The device of claim 7, wherein the NMOS FET is a FinFET, wherein the silicon-containing layer forms a fin of the FinFET, and wherein the silicon-containing stressors extend into the silicon germanium layer.

12. The device of claim 7, wherein the NMOS FET is a planar NMOS FET.

13. A device comprising:
    a silicon-containing layer stacked on a silicon germanium layer supported by a silicon substrate, the silicon germanium layer is relaxed, the silicon-containing layer un-relaxed and free from germanium;

isolation regions abutting sidewalls of the silicon substrate, the silicon germanium layer, and the silicon-containing layer;

a gate stack of an n-type metal-oxide-semiconductor (NMOS) field-effect transistor (FET) over the silicon-containing layer and the silicon germanium layer, wherein a portion of the silicon-containing layer forms a channel region of the NMOS FET; and silicon-containing stressors formed in recesses in the silicon-containing layer, wherein the silicon-containing stressors have a lattice constant smaller than a lattice constant of the silicon germanium layer.

14. The device of claim 13, wherein a silicide region is disposed upon a gate electrode of the gate stack.

15. The device of claim 14, wherein a contact plug is disposed upon the silicide region.

16. The device of claim 15, wherein an interlevel dielectric abuts sidewalls of the contact plug and is disposed over a contact etch stop layer at least partially covering spacers on opposing sides of the gate electrode.

17. The device of claim 13, wherein the NMOS FET is a FinFET, and wherein the silicon-containing layer forms a fin of the FinFET.

18. The device of claim 13, wherein the silicon-containing stressors extend into the silicon germanium layer.

19. The device of claim 7, wherein the silicon-containing layer comprises a silicon germanium layer.

20. The device of claim 1, wherein the NMOS FET is a FinFET, wherein a bottommost surface of the gate stack is above an uppermost surface of the silicon germanium layer.

\* \* \* \* \*